(12) United States Patent
Coldren et al.

(10) Patent No.: US 6,909,734 B2
(45) Date of Patent: Jun. 21, 2005

(54) HIGH-POWER, MANUFACTURABLE SAMPLED GRATING DISTRIBUTED BRAGG REFLECTOR LASERS

(75) Inventors: Larry A. Coldren, Santa Barbara, CA (US); Gregory A. Fish, Santa Barbara, CA (US); Michael C. Larson, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 0 days.

(21) Appl. No.: 09/872,438

(22) Filed: Jun. 1, 2001

(65) Prior Publication Data

US 2002/0105991 A1 Aug. 8, 2002

Related U.S. Application Data

(63) Continuation-in-part of application No. 09/614,895, filed on Jul. 12, 2000, now Pat. No. 6,349,106, and a continuation-in-part of application No. 09/614,674, filed on Jul. 12, 2000, now Pat. No. 6,624,000, and application No. 09/614,665, filed on Jul. 12, 2000, now Pat. No. 6,687,278, and application No. 09/614,378, filed on Jul. 12, 2000, now Pat. No. 6,628,690, and application No. 09/614,377, filed on Jul. 12, 2000, now Pat. No. 6,580,739, and application No. 09/614,376, filed on Jul. 12, 2000, now Pat. No. 6,614,819, and application No. 09/614,375, filed on Jul. 12, 2000, now Pat. No. 6,658,035, and application No. 09/614,224, filed on Jul. 12, 2000, now Pat. No. 6,654,400, and application No. 09/614,195, filed on Jul. 12, 2000, now Pat. No. 6,574,259.

(60) Provisional application No. 60/209,068, filed on Jun. 2, 2000, provisional application No. 60/152,072, filed on Sep. 2, 1999, provisional application No. 60/152,049, filed on Sep. 2, 1999, and provisional application No. 60/152,038, filed on Sep. 2, 1999.

(51) Int. Cl.[7] .................................................. H01S 3/08

(52) U.S. Cl. ........................ 372/96; 372/43; 372/46; 372/50

(58) Field of Search ........................ 372/96, 46, 50

(56) References Cited

U.S. PATENT DOCUMENTS

| | | | |
|---|---|---|---|
| 4,622,672 A | 11/1986 | Coldren et al. | 372/32 |
| 4,896,325 A | 1/1990 | Coldren | 372/20 |
| 5,084,894 A * | 1/1992 | Yamamoto | 372/50 |
| 5,088,097 A | 2/1992 | Ono et al. | 372/20 |
| 5,145,792 A * | 9/1992 | Hirata | 438/36 |

(Continued)

FOREIGN PATENT DOCUMENTS

WO WO 99/40654 8/1999

OTHER PUBLICATIONS

H. Ishii et al., "Mode Stabilization Method for Superstructure–Grating DBR Lasers," Jnl. of Lightwave Technology, 1998, 16(3): 433–442.

G. Sarlet et al., "Wavelength and Mode Stabilization of Widely Tunable SG–DBR and SSG–DBR Lasers," IEEE Photonics Tech. Lett., 1999, 11(11): 1351–1353.

I.A. Avrutsky et al., "Design of Widely Tunable Semiconductor Lasers and the Concept of Binary Superimposed Gratings (BSG's)," IEEE Journal of Quantum Elec., Apr. 1998, 34(4): 729–741.

(Continued)

*Primary Examiner*—Don Wong
*Assistant Examiner*—Dung (Michael) T Nguyen
(74) *Attorney, Agent, or Firm*—Gates & Cooper LLP (57) ABSTRACT

A tunable laser is disclosed including a gain section for creating a light beam over a bandwidth, a phase section for controlling the light beam around a center frequency of the bandwidth, a waveguide for guiding and reflecting the light beam in a cavity including a relatively low energy bandgap separate-confinement-heterostructure (SCH), a front mirror bounding an end of the cavity and a back mirror bounding an opposite end of the cavity wherein gain is provided by at least one of the group comprising the phase section, the front mirror and the back mirror.

28 Claims, 9 Drawing Sheets

U.S. PATENT DOCUMENTS

| | | | | |
|---|---|---|---|---|
| 5,274,649 A | * | 12/1993 | Hirayama et al. | 372/20 |
| 5,325,392 A | | 6/1994 | Tohmori et al. | 372/96 |
| 5,347,526 A | * | 9/1994 | Suzuki et al. | 372/20 |
| 5,379,318 A | * | 1/1995 | Weber | 372/96 |
| 5,392,311 A | | 2/1995 | Makuta | 372/96 |
| 5,452,118 A | * | 9/1995 | Maruska | 359/191 |
| 5,579,328 A | | 11/1996 | Habel et al. | 372/31 |
| 5,581,572 A | * | 12/1996 | Delorme et al. | 372/50 |
| 5,715,271 A | | 2/1998 | Huang et al. | 372/102 |
| 5,790,581 A | | 8/1998 | Nitta | 372/50 |
| 5,838,714 A | * | 11/1998 | Delorme | 372/96 |
| 5,841,799 A | | 11/1998 | Hiroki | 372/19 |
| 5,936,994 A | * | 8/1999 | Hong et al. | 372/96 |
| 6,066,859 A | * | 5/2000 | Stegmueller | 257/21 |
| 6,208,454 B1 | * | 3/2001 | Koren et al. | 359/326 |
| 6,345,135 B1 | | 2/2002 | Reid et al. | 385/37 |

OTHER PUBLICATIONS

L.A. Coldren et al., "Photonic Integrated Circuits," Diode Lasers and Photonic Integrated Circuits, John Wiley & Sons, 1995, ch. 8: 342–391.

L.A. Coldren et al., "Properties of Widely–Tunable Integrated WDM Sources and Receivers," 1997 Annual Meeting (LEOS), San Francisco, CA, USA, Nov. 1997, Paper No. TuY1, 331–332 [62–63].

L.A. Coldren et al., "Tunable Lasers for Photonic Integrated Circuits," IEEE Summer Topical on Integrated Optoelectronics, Lake Tahoe, NV, USA, Jul. 1994, Paper No. W4.1, 88–89.

L.A. Coldren, "Widely–Tunable and Vertical–Cavity Lasers: DBR's on Different Planes," Integrated Photonics Research, San Francisco, CA, USA, Feb. 1994, Paper No. ThA3–1, 75–76.

G. Fish et al., "Compact, 4x4 InGaAsP–InP Optical Crossconnect with a Scaleable Architecture," IEEE Photonics Tech. Lett., Sep. 1998, 10(9): 42–44.

G. Fish et al., "Improved Compositional Uniformity of InGaAsP Grown by MOCVD Through Modification of the Susceptor Temperature Profile," Journal of Crystal Growth, 1997, 32–38.

G. Fish et al., "InGaAsP/InP Scaleable, Photonic Crossconnects Using Optically Amplified Suppressed Modal Interference Switch Arrays," Integrated Photonics Research '98, Victoria, Canada, Mar. 1998, Paper No. ITuE4, 243–245 [39–41].

G. Fish et al., "InGaAsP/InP Suppressed Modal Interference Switches with Integrated Curved Amplifiers for Scaleable Photonic Crossconnects," Optical Fiber Conference '98, San Jose, CA, USA, Feb. 1998, Paper No. TuH4, 1pp.

G. Fish et al., "Suppressed Modal Interferences Switches with Integrated Curved Amplifiers for Scaleable Photonic Crossconnects," IEEE Photonics Tech. Lett., Feb. 1998, 10(2)28–30.

M.E. Heimbuch et al., "Tertiarybutylarsine and Tertiarybutylphosphine for the MOCVD Growth of Low Threshold 1.55 $\mu$m $In_xGa_{1-x}As$/InP Quantum–Well Lasers," Journal of Elec. Materials, 1994, 23(2): 77–81.

H. Ishii et al., "Broad–range Wavelength Coverage (62.4 nm) with Superstructure–Grating DBR Laser," Elec. Lett., Feb. 29, 1996, 32(5): 454–455.

H. Ishii et al., "Quasicontinuous Wavelength Tuning in Super–Structure–Grating (SSG) DBR Lasers," IEEE Journal of Quantum Elec., Mar. 1996, 32(3): 433–441.

Y–H. Jan et al., "Widely Tunable Integrated Filter/Receiver with Apodized Grating–Assisted Codirectional Coupler (INVITED)," SPIE Photonics West '98, San Jose, CA, USA, Jan. 1998, Paper No. 3290–232: 24–27.

V. Jayaraman et al., "Continuous–Wave Operation of Sampled Grating Tunable Lasers with 10 mwatt Output Power, >60 nm Tuning, and Monotonic Tuning Characteristics," Indium Phosphide Conference, Santa Barbara, CA, USA, Mar. 1994, 33–36 [82–85].

V. Jayaraman et al., "Demonstration of Broadband Tunability in a Semiconductor Laser Using Sampled Gratings," Appl. Phys. Lett., May 1992, 60(19): 110–112.

V. Jayaraman et al., "Extended Tuning Range in Sampled Grating DBR Lasers," IEEE Photonics Tech. Lett., May 1993, 5(5): 103–105.

V. Jayaraman et al., "Extended Tuning Range Semiconductor Lasers with Sampled Gratings," LEOS '91, San Jose, CA, USA, Nov. 1991, Paper No. SDL15.5: 82 [113].

V. Jayaraman et al., "Theory, Design, and Performance of Extended Tuning Range Semiconductor Lasers with Sampled Gratings," IEEE Journal of Quantum Elec., Jun. 1993, 29(6): 92–102.

V. Jayaraman et al., "Very Wide Tuning Range in a Sampled Grating DBR Laser," Int. Semiconductor Laser Conference, Takamatsu, Japan, Sep. 1992, 108–109.

V. Jayaraman, et al., "Wide Tunability and Large Mode–Suppression in a Multi–Section Semiconductor Laser Using Sampled Gratings," Integrated Photonics Research '92, New Orleans, LA, USA, Apr. 1992, Paper No. WF1, 306–307 [106–107].

V. Jayaraman et al., "Widely Tunable Continuous–Wave InGaAsP/InP Sampled Grating Lasers," Elec. Lett., Sep. 1994, 30(18): 90–91.

S–L. Lee et al., "Direct Modulation of Widely Tunable Sampled Grating DBR Lasers," SPIE, 1996, 2690(223): 223–230 [64–71].

S–L. Lee et al., "Dynamic Responses of Widely Tunable Sampled Grating DBR Lasers," Photonics Tech. Lett., Dec. 1996, 8(12): 72–74.

S–L. Lee et al., "Field–Induced Guide/Antiguide Modulators on InGaAsP/InP," Elec. Lett., Jun. 9, 1994, 30(12): 954–955 [86–87].

S–L. Lee et al., "Integration of Semiconductor Laser Amplifiers with Sampled Grating Tunable Lasers for WDM Applications," IEEE Journal of Selected Topics in Quantum Elect., Apr. 1997, 3(2): 49–61.

B. Mason et al., "Design of Sampled Grating DBR Lasers with Integrated Semiconductor Optical Amplifiers," IEEE Photonics Tech. Lett., Jul. 2000, 12(7): 1–3.

B. Mason et al. "Directly Modulated Sampled Grating DBR Lasers for Long–Haul WDM Communication Systems," IEEE Photonics Tech. Lett., 9(3): 46–48.

B. Mason et al., "Monolithic Integration of a Widely Tunable Laser and an Electro–Absorption Modulator," Integrated Photonics Research '99, Santa Barbara, CA, USA, Jul. 1999, Paper No. RME2, 53–55 [7–9].

B. Mason et al., "Ridge Waveguide Sampled Grating DBR Lasers with 22–nm Quasi–Continuous Tuning Range," IEEE Photonics Technology Letters, Sep. 1998, 10(9): 19–21.

B. Mason et al., "Sampled Grating DBR Lasers with 22nm Quasi–Continuous Tuning and Monolithically Integrated Wavelength Monitors," Int'l. Semiconductor Laser Conf. '98, Nara, Japan, Oct. 1998, Paper No. ThC4, 22–23.

B. Mason et al., "Sampled Grating DBR Lasers with Integrated Wavelength Monitoring," Integrated Photonics Research '98, Victoria, Canada, Mar. 1998, Paper No. IMD5, 52–54 [13–15].

B. Mason et al., "Tunable Sampled–Grating DBR Lasers with Integrated Wavelength Monitors," IEEE Photonics Tech. Lett., Aug. 1998, 10(8): 16–18.

B. Mason et al., "Widely Tunable Lasers for Wavelength-Division Multiplexed Communications," Optical Fiber Communication '97, Dallas, TX, USA, Feb. 1997, 45.

B. Mason et al., "Widely Tunable Sampled Grating DBR Laser with Integrated Electroabsorption Modulators," IEEE Photonics Tech. Lett., Jun. 1999, 11(6): 4–6.

D.M. Tennant et al., "Multiwavelength Distributed Bragg Reflector Laser . . . Grating Mask," J. Vac. Sci. Technol. B, Nov./Dec. 1993, 11(6): 2509–2513.

* cited by examiner

FIG. 8B ized U.S. provisional patent application Ser. No. 60/209,068,
HIGH-POWER, MANUFACTURABLE SAMPLED GRATING DISTRIBUTED BRAGG REFLECTOR LASERS

CROSS-REFERENCE TO RELATED APPLICATIONS

This application claims the benefit under 35 U.S.C. §119 (e) of the following co-pending and commonly-assigned U.S. provisional patent application Ser. No. 60/209,068, filed Jun. 2, 2000, by Larry A. Coldren et al., and entitled "HIGH-POWER, MANUFACTURABLE SAMPLED-GRATING DBR LASERS," which application is incorporated by reference herein.

This application is a continuation-in-part of the following co-pending and commonly-assigned U.S. utility patent applications:

Ser. No. 09/614,224, filed Jul. 12, 2000, by Larry A. Coldren et al., now U.S. Pat No. 6,654,400, issued Nov. 25, 2003, and entitled "METHOD OF MAKING A TUNABLE LASER SOURCE WITH INTEGRATED OPTICAL AMPLIFIER";

Ser. No. 09/614,377, filed Jul. 12, 2000, by Larry A. Coldren et al., now U.S. Pat No. 6,580,739, issued Jun. 17, 2003, and entitled "INTEGRATED OPTO-ELECTRONIC WAVELENGTH CONVERTER ASSEMBLY";

Ser. No. 09/614,376, filed Jul. 12, 2000, by Larry A. Coldren et al., now U.S. Pat No. 6,614,819, issued Sep. 2, 2003, and entitled "METHOD OF CONVERTING AN OPTICAL WAVELENGTH WITH AN OPTO-ELECTRONIC LASER WITH INTEGRATED MODULATOR";

Ser. No. 09/614,378, filed Jul. 12, 2000, by Larry A. Coldren et al., now U.S. Pat No. 6,628,690, issued Sep. 30, 2003, and entitled "OPTO-ELECTRONIC LASER WITH INTEGRATED MODULATOR";

Ser. No. 09/614,895, filed Jul. 12, 2000, by Larry A. Coldren, now U.S. Pat No. 6,349,106, issued Feb. 19, 2002, and entitled "METHOD FOR CONVERTING AN OPTICAL WAVELENGTH USING A MONOLITHIC WAVELENGTH CONVERTER ASSEMBLY";

Ser. No. 09/614,375, filed Jul. 12, 2000, by Larry A. Coldren, now U.S. Pat No. 6,658,035, issued Dec. 12, 2003, and entitled "TUNABLE LASER SOURCE WITH INTEGRATED OPTICAL AMPLIFIER";

Ser. No. 09/614,195, filed Jul. 12, 2000, by Larry A. Coldren et al., now U.S. Pat No. 6,574,259, issued Jun. 3, 2003, and entitled "METHOD OF MAKING AN OPTO-ELECTRONIC LASER WITH INTEGRATED MODULATOR";

Ser. No. 09/614,665, filed Jul. 12, 2000, by Larry A. Coldren et al., now U.S. Pat No. 6,687,278, issued Feb. 3, 2004, and entitled "METHOD OF GENERATING AN OPTICAL SIGNAL WITH A TUNABLE LASER SOURCE WITH INTEGRATED OPTICAL AMPLIFIER"; and Ser. No. 09/614, 674, filed Jul. 12, 2000, by Larry A. Coldren, now U.S. Pat. No. 6,624,000, issued Sep. 23, 2003, and entitled "METHOD FOR MAKING A MONOLITHIC WAVELENGTH CONVERTER ASSEMBLY";

all of which are incorporated by reference herein, all of which are continuation-in-parts of the others, and all of which claim the benefit under 35 U.S.C. §119(e) to the following U.S. provisional patent applications:

Ser. No. 60/152,038, filed on Sep. 2, 1999, by Gregory Fish et al., and entitled "OPTOELECTRONIC LASER WITH INTEGRATED MODULATOR";

Ser. No. 60/152,049, filed on Sep. 2, 1999, by Larry Coldren, and entitled "INTEGRATED OPTOELECTRONIC WAVELENGTH CONVERTER"; and Ser. No. 60/152,072, filed on Sep. 2, 1999, by Beck Mason et al., and entitled "TUNABLE LASER SOURCE WITH INTEGRATED OPTICAL AMPLIFIER".

BACKGROUND OF THE INVENTION

1. Field of the Invention

The present invention relates generally to wide-range tunable semiconductor lasers and particularly to sampled-grating distributed Bragg reflector (SGDBR) lasers.

2. Description of the Related Art

Diode lasers are being used in such applications as optical communications, sensors and computer systems. In such applications, it is very useful to employ lasers that can be easily adjusted to output frequencies across a wide wavelength range. A diode laser which can be operated at selectably variable frequencies covering a wide wavelength range, i.e. a widely tunable laser, is an invaluable tool. The number of separate channels that can be switched between by a laser source in a given wavelength range is exceedingly limited without such a laser. Accordingly, the number of individual communications paths that can exist simultaneously switched in a system employing such range-limited lasers is similarly very limited. Thus, while diode lasers have provided solutions to many problems in communications, sensors and computer system designs, they have not fulfilled their potential based on the available bandwidth afforded by light-based systems. It is important that the number of channels be increased and that they may be selectively utilized in order for optical systems to be realized for many future applications.

For a variety of applications, it is necessary to have tunable diode lasers which can be selectively configured to emit substantially one of a wide range of wavelengths. Such applications include transmission sources and local oscillators in coherent lightwave communications systems, sources for other multi-channel lightwave communication systems, and sources for use in frequency modulated sensor systems. Continuous tunability is usually needed over some range of wavelengths.

In addition, widely tunable semiconductor lasers, such as the sampled-grating distributed-Bragg-reflector (SGDBR) laser, the grating-coupled sampled-reflector (GCSR) laser, and vertical-cavity lasers with micro-mechanical moveable mirrors (VCSEL-MEMs) generally must compromise their output power in order to achieve a large tuning range. The basic function and structure of SGDBR lasers is detailed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. Designs that can provide over 40 nm of tuning range have not been able to provide much more than a milliwatt or two of power out at the extrema of their tuning spectrum. However, current and future optical fiber communication systems as well as spectroscopic applications require output powers in excess of 10 mW over the full tuning range. The International Telecommunication Union (ITU) C-band is about 40 nm wide near 1.55 μm. There are other ITU bands as well that may be used including the L-band and the S-band.

It is desired to have a single component that can cover at least the entire C-band. Systems that are to operate at high bit rates may require more than 20 mW over the full ITU bands. Such powers are available from distributed feedback (DFB) lasers, but these can only be tuned by a couple of nanometers by adjusting their temperature. Thus, it is very desirable to have a source with both wide tuning range (>40 nm) and high power (>20 mW) without a significant increase in fabrication complexity over existing widely tunable designs.

The present invention discloses methods and devices of enhanced semiconductor laser, and particularly sampled-grating distributed Bragg reflector (SGDBR) lasers, which achieve high power over a wide tuning range and are manufactured using conventional techniques.

SUMMARY OF THE INVENTION

To address the issues described above, the present invention generally comprises a tunable laser comprising a gain section for creating a light beam through the well-known phenomena of spontaneous and stimulated emission over a bandwidth, a phase section for controlling the light beam around a center frequency of the bandwidth, a waveguide for guiding and reflecting the light beam in a cavity including a relatively low energy bandgap separate-confinement-heterostructure (SCH), a first or front mirror bounding an end of the cavity and a second or back mirror bounding an opposite end of the cavity wherein gain is provided by at least one of the group comprising the phase section, the front mirror and the back mirror.

Embellishments on the SGDBR design provide widely tunable devices that provide generally higher power than earlier SGDBR lasers. In addition, most of the embodiments of the present invention are relatively simple to manufacture.

As will be illustrated in the drawings below, some embodiments of the present invention simplify the basic SGDBR design, since they use the same active waveguide material throughout the device length, rather than requiring the fabrication of abutted active and passive sections. However, other embodiments include a modification of the bandgap of the waveguide regions in the mirrors and phase-shift sections. This modification may be accomplished with a simple quantum-well disordering process, selective area growth, or regrowth techniques that are well-known to those skilled in the art. In most cases the absorption edge of these sections needs be shifted only slightly, and thus, both the quantum-well disordering (or intermixing) and selective area growth procedures are easily accomplished. These latter processes also require no additional regrowth steps.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and in which is shown, by way of illustration, a preferred embodiment of the present invention. It is understood that other embodiments may be utilized and structural changes may be made without departing from the scope of the present invention.

Figure 1A:
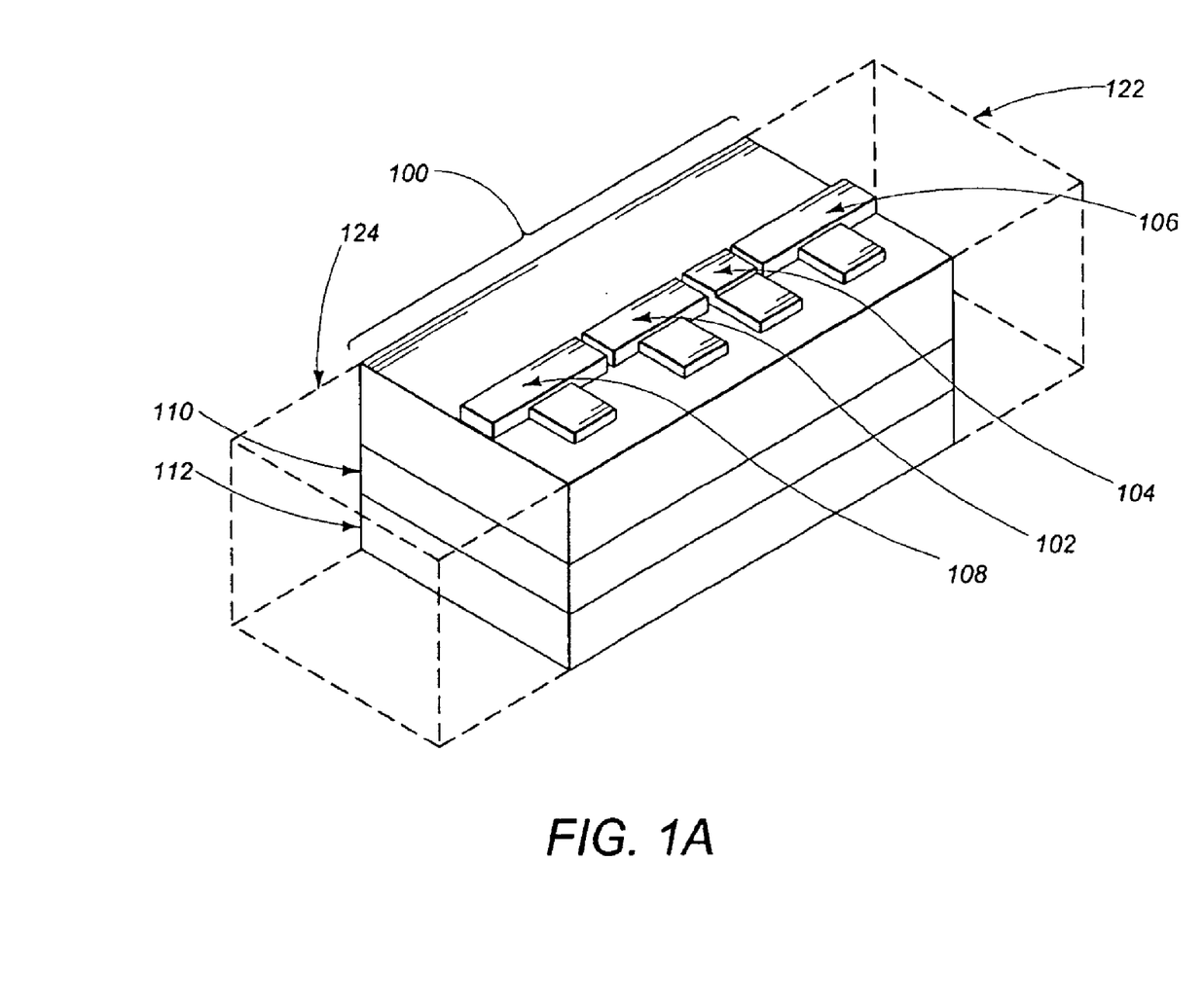
FIGS. 1A and 1B depict a SGDBR laser showing the four sections used to control the power and wavelength of the laser's emission.
Figure 1B:
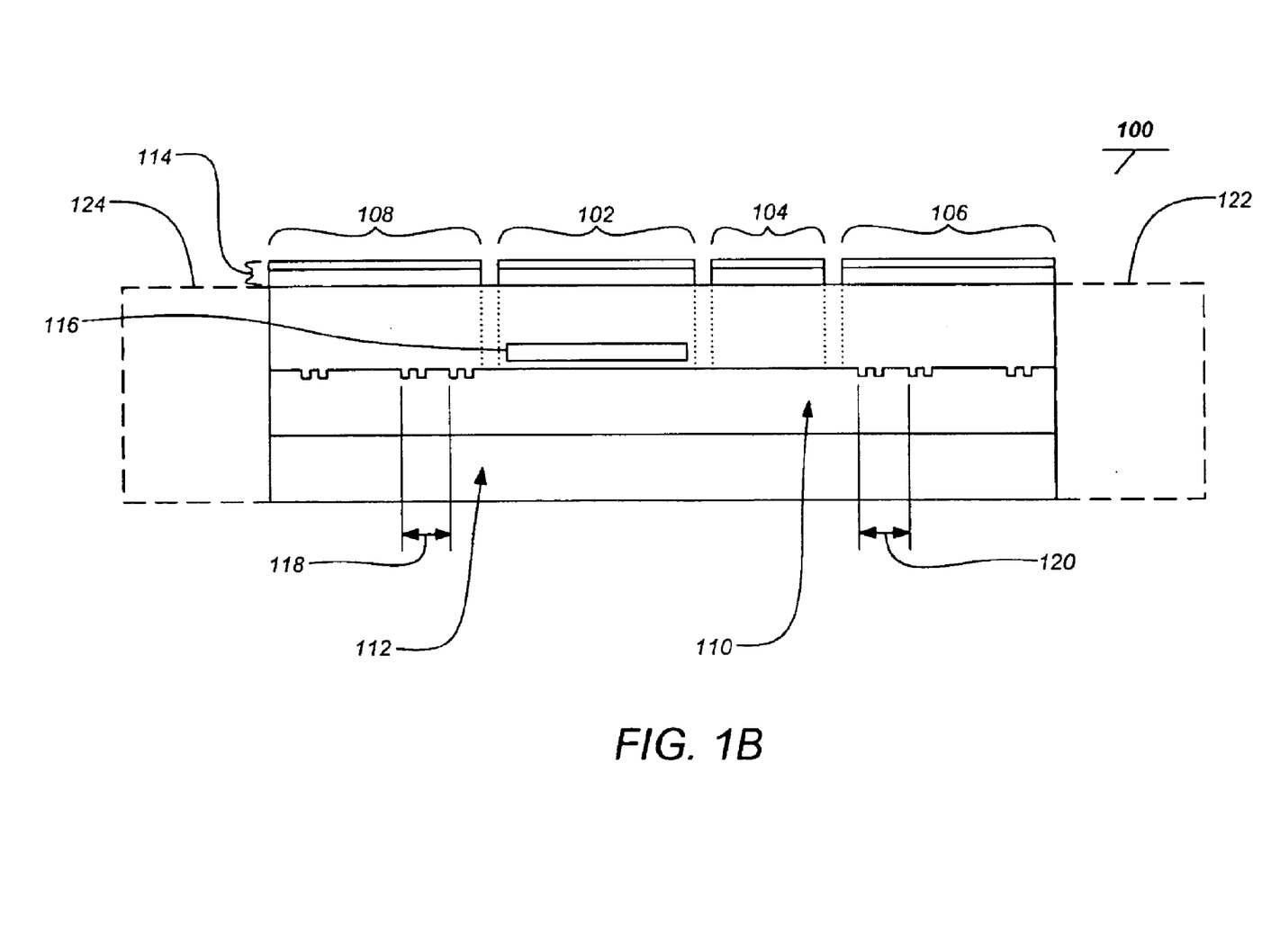

FIGS. 1A and 1B show a typical SGDBR laser illustrating the four sections that allow its unique tuning characteristics. The laser 100 is comprised of a gain section 102, a phase section 104, a first or front mirror 108 and a second or back mirror 106. Preferably disposed below these sections is a waveguide 110 for guiding and reflecting the light beam, while the entire device is formed on a substrate 112. In use, generally bias voltages are connected to electrodes 114 on the top of the device and a ground is connected to a lower substrate 112. When a bias voltage on the gain section 102 is above a lasing threshold, a laser output is produced from an active region 116.

The front and back mirrors 108, 106 are typically sampled grating mirrors that respectively include different sampling periods 118, 120. The gratings behave as wavelength-selective reflectors such that partial reflections are produced at periodic wavelength spacings of an optical signal carried in the cavity. The front and back sampled grating mirrors 108, 106 together determine the wavelength with the minimum cavity loss through their effective lengths and grating differential, however, the lasing wavelength can only occur at the longitudinal modes of the optical cavity in the waveguide 110. Therefore, it is important to adjust the mirrors 106, 108 and waveguide 110 modes to coincide, thereby achieving the lowest cavity loss possible for the desired wavelength. The phase section 104 of the device shown in FIG. 1 is used to adjust the optical length of the cavity in order to position the cavity modes.

Optional back-side monitor 122 and front-side semiconductor optical amplifier (SOA) and/or optical modulator 124 sections are also indicated. Currents are applied to the various electrodes 114 of the aforementioned sections to provide a desired output optical power and wavelength as discussed in U.S. Pat. No. 4,896,325, issued Jan. 23, 1990, to Larry A. Coldren, and entitled "MULTI-SECTION TUNABLE LASER WITH DIFFERING MULTI-ELEMENT MIRRORS", which patent is incorporated by reference herein. As described therein, a current to the gain section 102 creates light and provides gain to overcome losses in the laser cavity; currents to the two differing SGDBR wavelength-selective mirrors 106, 108 are used to tune a net low-loss window across a wide wavelength range to select a given mode; and a current to the phase section 104 provides for a fine tuning of the mode wavelength. It should also be understood that the sections ate somewhat interactive, so that currents to one section will have some effect on the parameters primarily controlled by the others.

Currents and voltages are applied and/or monitored at the optional sections to monitor power or wavelength, or provide amplification or modulation as specified in the following U.S. utility patent applications: Ser. No. 09/614,224, filed Jul. 12, 2000, by Larry A. Coldren et al., now U.S. Pat. No. 6,654,400, issued Nov. 25, 2003, and entitled "METHOD OF MAKING A TUNABLE LASER SOURCE WITH INTEGRATED OPTICAL AMPLIFIER"; Ser. No. 09/614,377, filed Jul. 12, 2000, by Larry A. Coldren, now U.S Pat. No. 6,580,739, issued Jun. 17, 2003, and entitled "INTEGRATED OPTO-ELECTRONIC WAVELENGTH CONVERTER ASSEMBLY"; Ser. No. 09/614,376, filed Jul. 12, 2000, by Larry A. Coldren et al., now U.S. Pat. No. 6,614,819, issued Sep. 2, 2003, and entitled "METHOD OF CONVERTING AN OPTICAL WAVELENGTH WITH AN OPTO-ELECTRONIC LASER WITH INTEGRATED MODULATOR"; Ser. No. 09/614,378, filed Jul. 12, 2000, by Larry A. Coldren et al., now U.S. Pat. No. 6,628,690, issued Sep. 30, 2003, and entitled "OPTO-ELECTRONIC LASER WITH INTEGRATED MODULATOR"; Ser. No. 09/614,895, filed Jul. 12, 2000, by Larry A. Coldren, now U.S. Pat. No. 6,349,106, issued Feb. 19, 2002, and entitled "METHOD FOR CONVERTING AN OPTICAL WAVELENGTH USING A MONOLITHIC WAVELENGTH CONVERTER ASSEMBLY"; Ser. No. 09/614,375, filed Jul. 12, 2000, by Larry A. Coldren et al., now U.S. Pat. No. 6,658,035, issued Dec. 2, 2003, and entitled "TUNABLE LASER SOURCE WITH INTEGRATED OPTICAL AMPLIFIER"; Ser. No. 09/614,195, filed Jul. 12, 2000, by Larry A. Coldren et al., now U.S. Pat. No. 6,574,259, issued Jun. 3, 2003, and entitled "METHOD OF MAKING AN OPTO-ELECTRONIC LASER WITH INTEGRATED MODULATOR"; Ser. No. 09/614,665, filed Jul. 12, 2000, by Larry A. Coldren et al., now U.S. Pat. No. 6,687,278, issued Feb. 3, 2004, and entitled "METHOD OF GENERATING AN OPTICAL SIGNAL WITH A TUNABLE LASER SOURCE WITH INTEGRATED OPTICAL AMPLIFIER"; and Ser. No. 09/614,674, filed Jul. 12, 2000, by Larry A. Coldren, now U.S. Pat. No. 6,624,000, issued Sep. 23, 2003, and entitled "METHOD FOR MAKING A MONOLITHIC WAVELENGTH CONVERTER ASSEMBLY"; all of which are incorporated by reference herein, all of which are continuation-in-parts of the others, and all of which claim the benefit under 35 U.S.C. §119(e) to the following U.S. provisional patent applications: Ser. No. 60/152,038, filed on Sep. 2, 1999, by Gregory Fish et al., and entitled "OPTOELECTRONIC LASER WITH INTEGRATED MODULATOR"; Ser. No. 60/152,049, filed on Sep. 2, 1999, by Larry Coldren, and entitled "INTEGRATED OPTOELECTRONIC WAVELENGTH CONVERTER"; and Ser. No. 60/1523,072, filed on Sep. 2, 1999, by Beck Mason et al., and entitled "TUNABLE LASER SOURCE WITH INTEGRATED OPTICAL AMPLIFIER." The current invention operates under the same general principles and techniques as these previous background inventions.

An important aspect of the present invention is to provide gain in the SGDBR mirror and/or phase shift sections to offset the loss that normally accompanies tuning by carrier injection. Another key aspect is to provide this gain in a configuration that has higher saturation power than the 5 to 10 mW that is typical of quantum-well active regions in the 1.5 to 1.6 µm wavelength range. The various embodiments of the current invention provide a combination of these two aspects, enabling devices with much higher output powers than achievable without these improvements.

Figure 2:
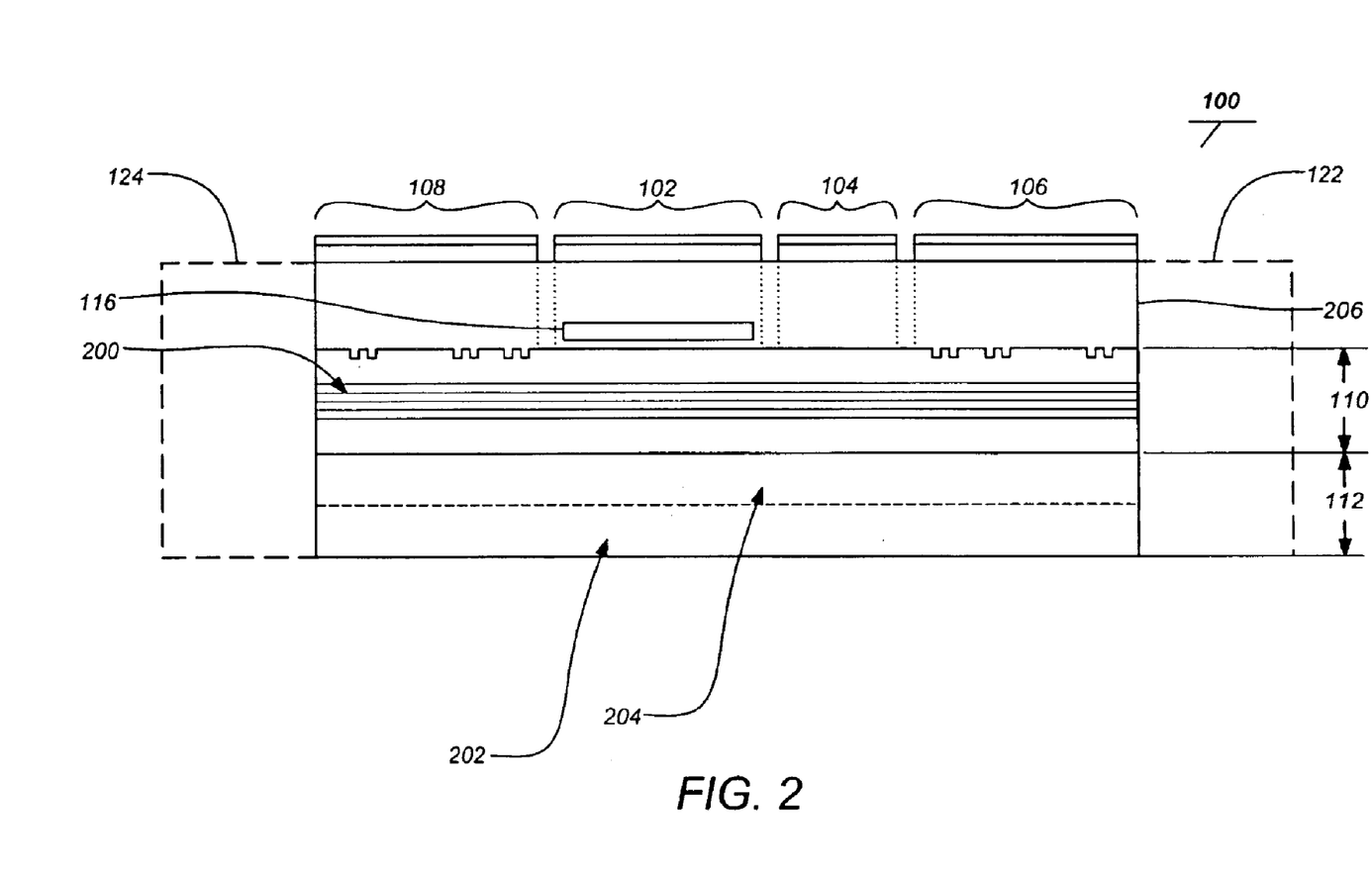
FIG. 2 is a cross sectional schematic view of a first class of embodiments of the current invention.

FIG. 2 is a cross sectional schematic view of a first class of embodiments of the current invention. Optional back-side monitor 122 and front side semiconductor optical amplifier (SOA) and/or optical modulator 124 sections are again indicated. Not indicated, is the optional disordering or intermixing of the quantum-well gain regions in the phase 104, back mirror 106, or front mirror 108 sections which provides for additional optimization of the laser 100. As illustrated, the device contains a common waveguide layer 110 that extends along its entire length. Thus, there are no optical discontinuities to cause unwanted reflections. This is true even if the optional quantum-well intermixing step is added, since the intermixing causes no net change in the modal index of refraction. Also, the simplicity of this cross section illustrates the relative simplicity of the fabrication sequence, which only requires one regrowth step to form the buried gratings for the mirrors 106, 108. However, an additional regrowth may be desirable for lateral optical waveguiding and current confinement.

The first embodiment uses a common active waveguide 110 throughout the length of the device. This waveguide 110 consists of a relatively low energy bandgap separate-confinement-heterostructure (SCH) 200 that contains centered shallow quantum wells. This structure is optimized such that gain builds up rapidly in the quantum wells as carriers are injected to a level roughly equal to that required for the device threshold. At this point, the shallow quantum wells are filled, and some carriers are already spilling out into the SCH region 200. Thus, with additional carrier injection the gain tends to saturate, having only a slight increase in the desired optical band as additional injected carriers fill the higher bandgap SCH region 200. However, the build up of carriers in the SCH will provide a desirable index of refraction change. Thus, by altering the relative biases of the various SGDBR laser sections 102–108, the various indexes can be adjusted while the net gain still remains at its required threshold value. Also, since the differential gain (slope of gain versus carrier density) is relatively low above the gain roll-over point, the saturation power tends to be much higher.

The build-up of carriers in the SCH region 200 would normally be accompanied by a net free-carrier absorption loss, but in this case, this is partially or fully compensated by the slight increases in modal gain with additional carriers. These increases are enhanced due to band shrinkage, a well known many-body effect that tends to reduce the bandgap energy as a large carrier density is obtained. Thus, the free-carrier absorption associated with the build up of carriers in the SCH region 200 is also at least partially compensated by band-to-band stimulated emission that can now occur in the reduced bandgap SCH region at high carrier densities. Because gain is being provided only at the low energy edge of this population, the saturation power is again enhanced. To achieve this desired operation, the bandgaps and numbers of quantum-wells as well as the bandgap and width of the SCH region must be carefully specified.

Other embodiments of the present invention include a modification of the absorption and gain properties of one or more of the phase 104, front mirror 108 or back mirror 106 sections. These embodiments can therefore provide a better optimization of the gain properties of the active region 102 while still providing the desirable high-saturation-power loss-compensation in the mirrors 106, 108 and/or phase-shift 104 sections. This modification can be accomplished either by selective quantum-well intermixing, selective area growth or by butt-joint regrowth of waveguides of different bandgap. For example, for the quantum-well intermixing embodiments, one can use ion-implantation, of phosphorous above the waveguide 110 to create vacancies that can then be diffused in a heat treatment step to intermix the quantum-wells with the surrounding SCH waveguide 110 material. This intermixing raises the net absorption edge in the quantum wells as well as lowering the absorption edge of the adjacent SCH regions 200. Thus, the disordered regions can now function mostly like passive tuning sections, which have significant index changes resulting from carrier injection. But with the present invention, they still have the desired added gain to compensate loss at high pumping, where the high carrier density lowers the bandgap via band shrinkage sufficiently for band-to-band transitions to occur. Again, the saturation power of the amplification in these intermixed sections is significantly higher than that of the original non-intermixed quantum well/SCH sections. The non-intermixed gain region can now have deeper quantum wells and higher barriers to provide gain more efficiently.

Further optimization is achieved in some of these embodiments by applying two levels of quantum-well intermixing, a variable-width selective-area-growth mask or two regrowth steps to provide three different bandgaps along the laser 100. The gain region 102 is constructed optimally with relatively low quantum-well and a high SCH bandgaps. A first change in bandgap (with a first level of disordering, for example) provides regions with slightly increased quantum-well bandgaps and slightly decreased SCH bandgaps. A second change in bandgap provides passive waveguide regions that can be tuned very efficiently as in conventional SGDBR designs, while having little or no loss compensation. (For example, this can be accomplished with a second level of disordering to almost completely intermix the quantum-wells with the SCH.) The first level of disordering provides regions with moderate levels of gain, but with higher saturation power than for the original non-intermixed regions. These have reduced tuning properties since the carriers are depleted by stimulated recombination, but they have better gain properties. One of these embodiments uses periodic selective disordering in the SGDBR mirrors with two bandgap regions to optimize the loss compensation with little compromise in tunability. A detailed description of the preferred embodiments follows.

For the first embodiment without any quantum-well disordering, the structure is first grown from the InP base substrate 202 to the top of the SCH waveguide region 110, typically in an MOCVD apparatus using standard epitaxial semiconductor growth techniques. The lower cladding 204 of the substrate 112 is typically n-type InP; the SCH waveguide 110 is typically InGaAsP of ~1.45–1.5 μm bandgap composition (the exact range to be specified below); the included quantum wells are typically InGaAs or InGaAsP wells, 7–10 nm in thickness, of 1.6–1.67 μm bandgap composition. At this point the "base wafer" is then processed to etch the sampled grating grooves into the surface of the SCH waveguide 110 (typically ~30 nm deep). Depending upon the type of lateral guiding to be used, the wafer is re-inserted into the growth reactor and additional layers grown. For a ridge or some types of buried heterostructure (BH) lateral waveguides, the upper cladding 206 (typically p-type InP) and contact layers 114 (typically p+InGaAs) are regrown. Then, for a ridge, surrounding material is etched down to the SCH waveguide 110 for lateral confinement, or for the buried heterostructure (BH), a deep ridge is etched down through the SCH and additional semi-insulating or some sort of npnp blocking layers grown to surround the ridge to provide current and optical confinement. Other regrowth variations are possible for the cladding and lateral guiding structures as are well known to those skilled in the art; this invention is primarily concerned with the design and formation of the SCH waveguide region 110.

For some embodiments, a selective bandgap change along the length is provided to better optimize the gain and tuning properties of the various sections. If the optional quantum-well disordering of some of the sections is used to reduce the need to overcome most of the quantum-well absorption, the first growth also includes a cladding layer (typically InP) of several hundred nm in thickness. This is then implanted (typically with P) to a depth less than the cladding thickness to create vacancies only in this cladding. These vacancies are then diffused through the SCH waveguide 110 and quantum wells to intermix the wells with the SCH material in an annealing step. Then this first top cladding is removed, removing all ion-implant damage; the gratings formed; and top layers regrown as before.

This selective change in bandgap along the length of the laser 100 can also be accomplished by selective-area growth that uses masking regions of varying width to provide for different composition and thickness quantum-wells and SCH during the first growth. It could also be accomplished by etching away certain regions after the first growth and regrowing the desired bandgap regions on a second growth.

Figure 3:
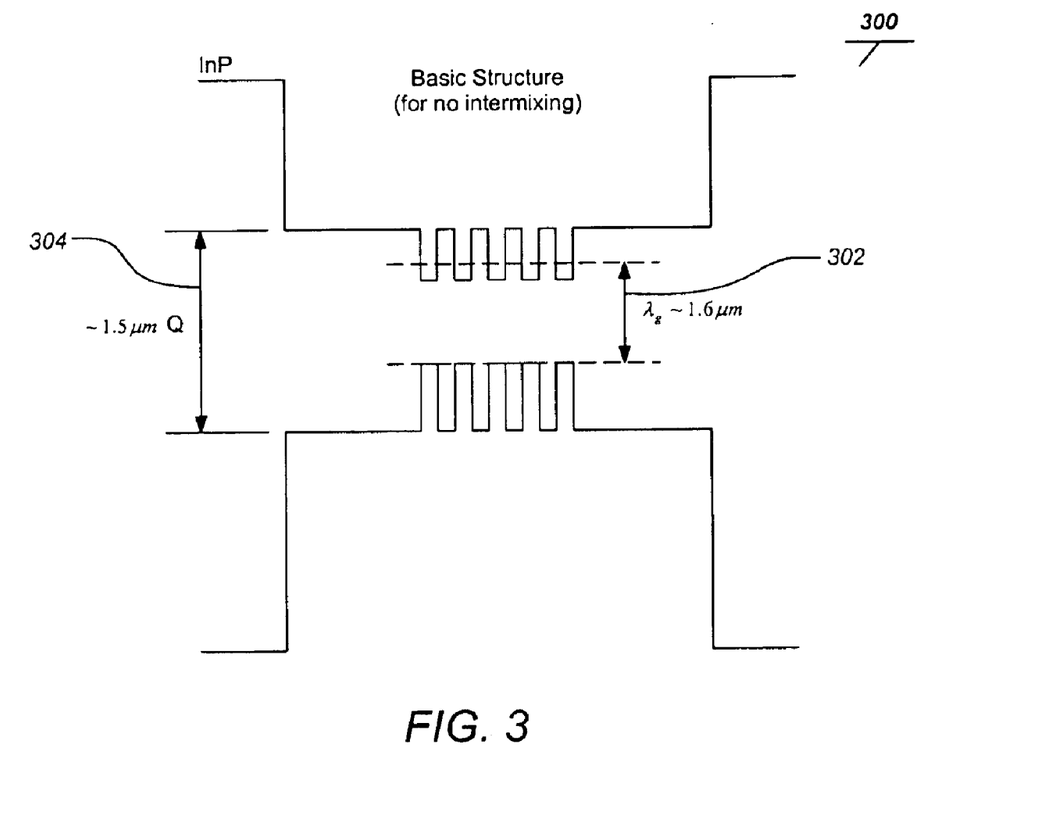
FIG. 3 is a transverse schematic of the energy bands plotted across the SCH waveguide region for the first embodiment in which a single uniform quantum-well SCH waveguide is used throughout the entire device length.

FIG. 3 is a transverse schematic 300 of the energy bands plotted across the SCH waveguide region 110 for the first embodiment in which a single uniform quantum-well SCH waveguide is used throughout the entire device length. InGaAsP/InP materials are assumed but others known to those skilled in the art may be used in a similar way. As shown in FIG. 3, a key aspect of this first embodiment of the present invention is to select the relative bandgap energies or optical absorption edges properly to accomplish the desired gain, tuning and loss properties in the various sections, all from a common waveguide structure.

As illustrated in FIG. 3, the as-grown waveguide guide consists of a relatively low bandgap energy SCH 302 that contains centered shallow quantum wells. This structure is optimized such that gain builds up rapidly in the quantum wells as carriers are injected to a level roughly equal to that requited for the device threshold 304. At this point the shallow quantum wells are filled, and some carriers are already spilling out into the SCH region. Thus, with additional carrier injection the gain tends to saturate, having only a slight increase in the desired optical band as additional injected carriers fill the higher bandgap SCH region. However, the build up of carriers in the SCH will provide a desirable index of refraction change. Thus, by altering the relative biases of the various SGDBR laser sections, the various indexes can be adjusted while the net gain still remains at its required threshold value.

The analysis indicates that optimal values for the SCH bandgap is 1 to 2 kT (or 26 to 52 meV larger in energy than the lasing energy), or about 50 to 100 nm lower in wavelength near 1550 nm. The lasing energy is typically approximately equal to the lowest calculated subband transition energy in the quantum-well with no pumping. Bandgap shrinkage reduces the bandgap and this lowest subband energy about 30 meV at typical threshold carrier densities, and the lineshape rounding and state filling combine to put the typical lasing wavelength back at about the same point as the carrier-free calculated subband edge. This separation between the lasing energy and the SCH waveguide absorption edge is much smaller than normal in typical multiple-quantum-well-SCH lasers, where it is usually desired to have good carrier confinement to the quantum wells. The separation results in a gain vs current density characteristic that saturates at relatively low values.

For operation near 1550 nm, the quantum-wells are most desirably composed of compressively strained InGaAs or InGaAsP with about 1% strain, although various other well designs may work relatively well. Varying the strain and composition will result in wells of different widths; the ternary wells, with the most compressive strain, will be narrowest with the lowest saturated gain, and the quaternary wells, with the least compressive strain, will be the widest with the largest saturated gain. The number of wells and the width desired will depend upon the cavity loss of the particular device under consideration. Generally, the gain should saturate at about the threshold gain level. So, the specification is to select the number of wells and composition to achieve this condition.

With this design the carrier density in the SCH regions can be modulated by varying the bias currents to the various sections. This modulation in turn varies the refractive index and the optical path length and/or Bragg wavelength of the particular section in question to tune the laser. Thus, the currents to the various electrodes have somewhat the same function as in the prior-art SGDBR laser. However, it is generally necessary to reduce the bias in one section at the same time it is increased in another due to the clamping of the net modal gain in the device to its threshold value. This effect is minimized by operating in the saturated region of the gain curve, but it still suggests that best tuning is accomplished by simultaneously decreasing one current while increasing another.

Figure 4:
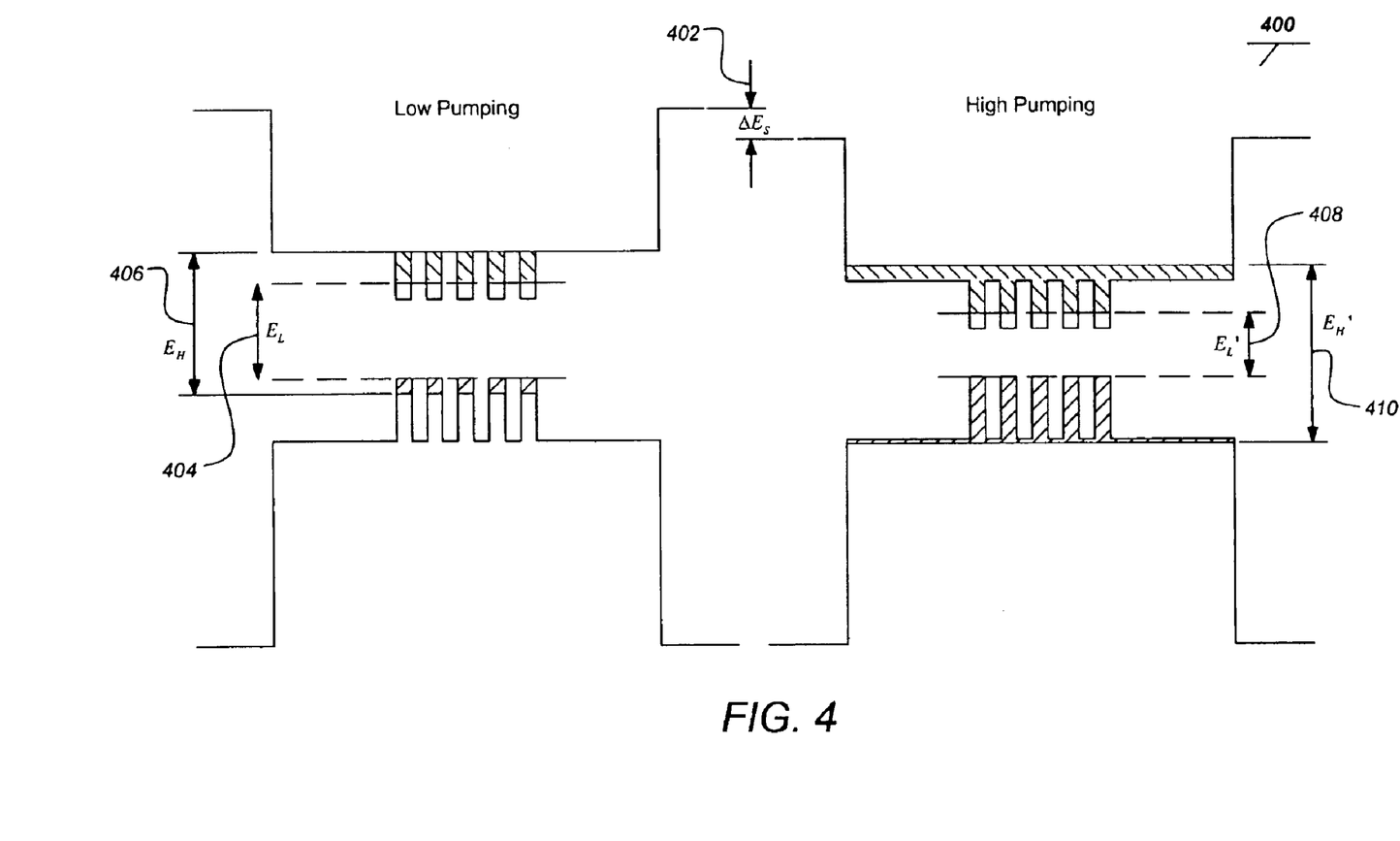
FIG. 4 illustrates the band structure at low and high carrier injection levels.

FIG. 4 illustrates the band structure 400 at low and high carrier injection levels (i.e. low and high pumping). The unwanted loss associated with the build-up of carriers in the SCH region is partially compensated by slight increases in modal gain associated with band-to-band transitions that now can exist in the SCH due to significant band shrinkage 402, $\Delta E_s$, which lowers the SCH bandgap to fall within the lasing wavelength range at high carrier densities where the material is inverted. As illustrated in FIG. 4, at high injection levels the carriers spill out of the quantum wells to fill the SCH region. This provides the change in refractive index. However, the band shrinkage 402, $\Delta E_s$, now moves the bandgap of the SCH to be below the lasing transition energy. Fortunately, at the conduction/valence band state, occupation is inverted so that net gain results. These effects, together with the fact that there is gain compensation of passive and scattering losses in the first place with proper biasing, leads to output powers much higher than possible with prior art designs. FIG. 4 illustrates the low and high energy levels at low pumping 404, 406 relative to the low and high energy levels at high pumping 408, 410.

Figure 5:
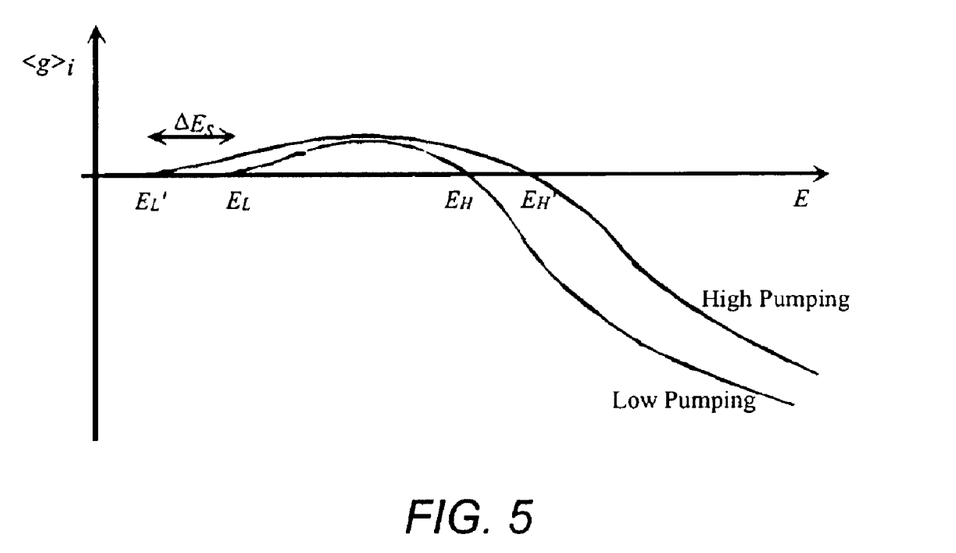
FIG. 5 illustrates the modal gain vs. energy for the carrier densities of FIG. 4.
Figure 6:
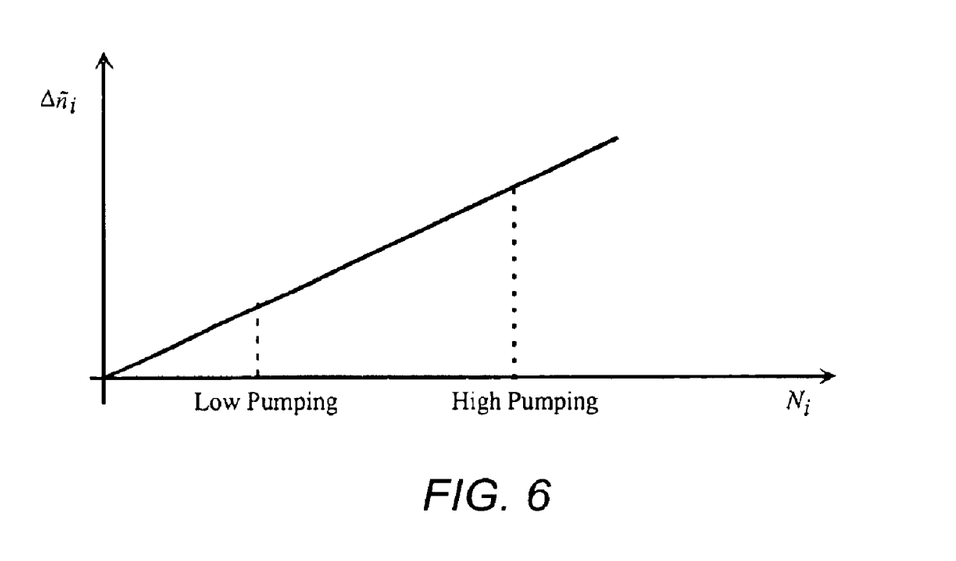
FIG. 6 illustrates the modal index vs. carrier density.

FIGS. 5 and 6 further explain the modal gain/loss characteristics of a typical section having the basic design of the current invention. The same two pumping levels suggested in FIG. 4 are considered. FIG. 5 illustrates the modal gain vs. energy for the carrier densities of FIG. 4. FIG. 6 shows the modal index vs. carrier density.

FIG. 5 sketches the gain for the two pumping levels of FIG. 4. The first is for moderate pumping, which might typically be sufficient to provide the threshold modal gain level for the center wavelength if all sections were pumped equally. Positive gain extends from a low energy 404, $E_L$, the energy separation of the unperturbed subband edges, to a high energy 406, $E_H$, which extends from the conduction band edge of the SCH (suggesting a large percentage of carriers in the SCH) to some valence band energy still below the quantum-well barrier. It is important to realize that with a large percentage of carriers in the SCH, there is still a much higher carrier density in the quantum wells. That is, the modal index tuning, and thus wavelength tuning, is still small as shown in FIG. 6. The second curve illustrates the gain under high pumping. It may be necessary to reduce the pumping slightly elsewhere to avoid carrier clamping, but as shown, there is little gain increase at any one wavelength, so this is may not be necessary. The important point is that the carrier density in the SCH is much higher, and this provides significant tuning as shown in FIG. 6. The gain spectrum is significantly broadened, from a low energy 408, $E_L'$ to a high energy 410, $E_H'$, but there is little increase at its peak due to the saturation of available states in the lasing band.

The gain characteristics of FIG. 5 also indicate that the saturation power for this configuration should be large. As may be found in various works, for example by Equations (8.18) through (8.24) in Chapter 8 of *Diode Lasers and Photonic Integrated Circuits*, by L. Coldren and S. Corzine, 1995, which is incorporated by reference herein, the saturation characteristics of the incremental gain g, for an optical power, P, are given by, $$g = \frac{g_0}{1 + P/P_S}$$

where $g_0$ is the small-signal gain, and the saturation power, $$P_s = \frac{wd(h\upsilon)}{a\Gamma_{XY}\tau}$$

The parameters, w and d are the width and thickness of the active region containing the carriers, (hυ) is the photon energy, a is the differential gain, dg/dN, $\Gamma_{xy}$ is the transverse confinement factor measuring the relative gain/optical mode overlap, and τ is the carrier lifetime. Now as the carriers spill out into the SCH region giving characteristics as shown in FIG. 5, the differential gain, a, becomes small (less than 20% of the best quantum-well gain regions), and the thickness d, containing carriers, increases more than the confinement factor, $\Gamma_{XY}$. Thus, the saturation power increases by several times, enabling the output power to be several tens of milliwatts.

Figure 7:
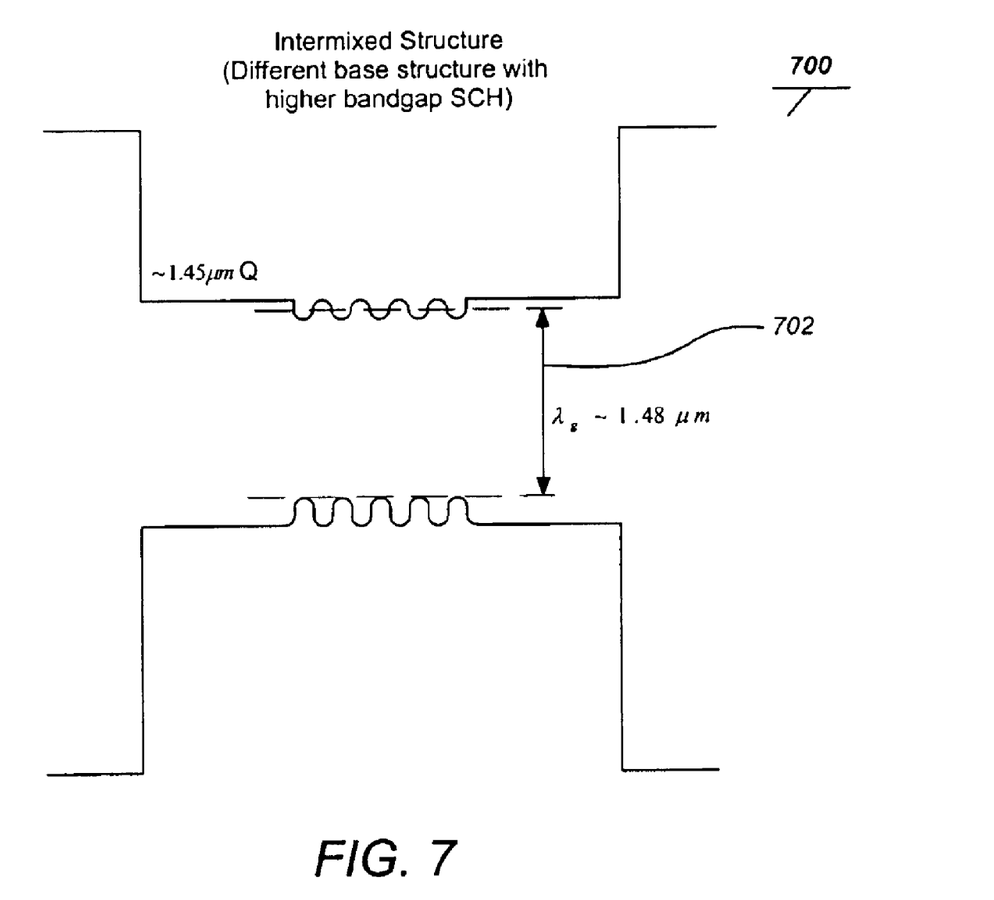
FIG. 7 illustrates the band structure of an intermixed section in another embodiment of the invention.

FIG. 7 shows the band structure 700 of an intermixed section (or one formed by selective-area growth or butt-joint regrowth) that exists in another embodiment where a change in bandgap in the mirror and/or phase-shift regions is created. The original growth also begins with a higher bandgap SCH to better optimize the active region. After intermixing the quantum well bandgap is raised and the SCH bandgap 702 reduced slightly to provide more optimum operation of both the gain and tuning sections. Typical SCH bandgap values of the starting material in this case would be from 1.45 to 1.4 μm. The SCH bandgap 702 of the intermixed structure 700 is higher than the SCH bandgap of the non-intermixed structure 300.

Yet another embodiment of the present invention reduces the effects of gain clamping on the freedom to vary the carrier density in any one section as well as the need to bias each section to at least transparency. In this case, the device works more similar to the prior art SGDBR laser with the important exception that we still get some measure of loss compensation of the free-carrier absorption. This occurs if the disordered quantum-well region has a bandgap 1–2 kT more than the center of the lasing wavelength band. Thus, at higher pumping levels where higher numbers of carriers are being injected, band shrinkage move the bandedge of the SCH down to the level where band-to-band transitions are possible in the SCH at the lasing wavelength. Thus, in the gain region where there is no intermixing, a somewhat higher bandgap SCH region exists to provide better carrier confinement, while in the intermixed regions the desired loss compensation at higher pumping levels still exists. Thus, there is less compromise in the desirable individual properties of the various sections.

Figure 8A:
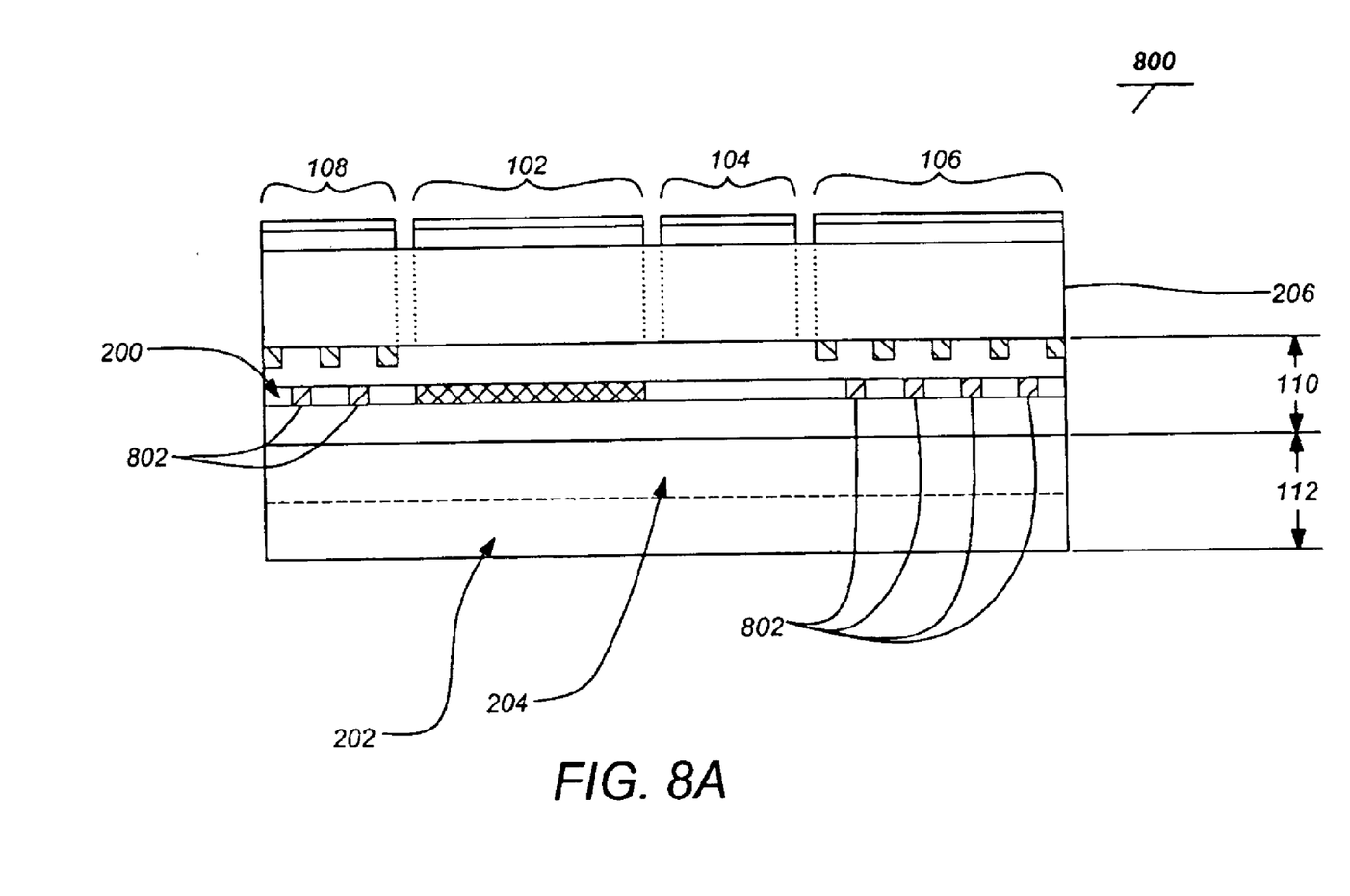
FIGS. 8A–8B illustrate another embodiment in which three different bandgap regions are created.
Figure 8B:
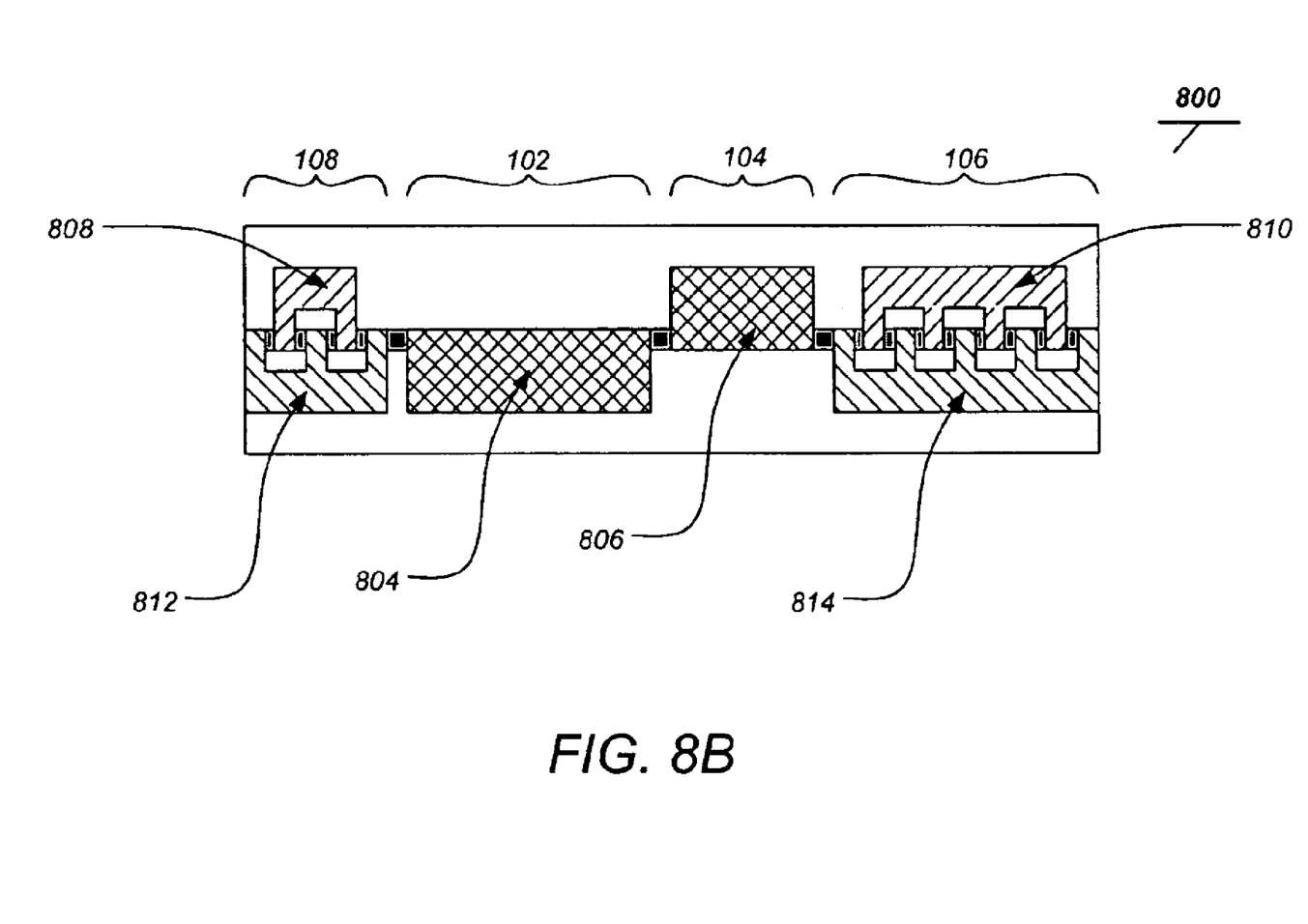

FIGS. 8A–8B illustrate an embodiment in which three different bandgap regions are created. The two lower bandgap regions 802 are placed periodically in the SGDBR mirror sections 106, 108 as illustrated in FIG. 8A. FIG. 8B illustrates a possible separate electrical connection to two of these that are situated in the SGDBR mirror sections 106, 108. The electrical contacts for the gain section 804 and the phase section 806 are shown as typical. The front and back mirrors 108, 106 each have gain contacts 808, 810 interlaced with tuning contacts 812, 814. This is not essential, but it will provide more optimized operation, but at the expense of having an additional current port in each mirror. Here, the SCH region in the gain section can have a still larger bandgap (~1.3–1.4 $\mu$m) and quantum-wells optimized for the most efficient operation of this section; the first disordered region (second bandgap) will intermix the quantum-wells to have a bandgap that is slightly increased and an SCH that is slightly reduced. The volume of carrier confinement will also be at least doubled. This region is used for gain in the mirrors. This is desirable because it will have a somewhat higher saturation power than the optimized quantum-well gain region material and still have good gain properties over most of the wavelength band. Bandgap shrinkage will again enable this since higher carrier densities will be necessary to provide good gain as compared to the optimized non-intermixed gain section. The second disordered region (third bandgap) will fully intermix the quantum-wells and the SCH to provide optimum tuning characteristics, but with no loss compensation. The partially intermixed gain region will be placed periodically in the mirrors to provide the loss compensation with relatively high saturation power.

As will be evident to those skilled in the art, the principle of the foregoing embodiments of this invention may also be used in creating optimized integrated amplifiers and modulators, as have been described in commonly-assigned and co-pending U.S. utility patent applications, Ser. No. 09/614,224, filed Jul. 12, 2000, by Larry A. Coldren et al., now U.S. Pat. No. 6,654,400, issued Nov. 25, 2003, and entitled "METHOD OF MAKING A TUNABLE LASER SOURCE WITH INTEGRATED OPTICAL AMPLIFIER"; Ser. No. 09/614,377, filed Jul. 12, 2000, by Larry A. Coldren, now U.S. Pat. No. 6,580,739, issued Jun. 17, 2003, and entitled "INTEGRATED OPTO-ELECTRONIC WAVELENGTH CONVERTER ASSEMBLY"; Ser. No. 09/614,376, filed Jul. 12, 2000, by Larry A. Coldren et al., now U.S. Pat. No. 6,614,819, issued Sep. 2, 2003, and entitled "METHOD OF CONVERTING AN OPTICAL WAVELENGTH WITH AN OPTO-ELECTRONIC LASER WITH INTEGRATED MODULATOR"; Ser. No. 09/614,378, filed Jul. 12, 2000, by Larry A. Coldren et al., now U.S. Pat. No. 6,628,690, issued Sep. 30, 2003, and entitled "OPTO-ELECTRONIC LASER WITH INTEGRATED MODULATOR"; Ser. No. 09/614,895, filed Jul. 12, 2000, by Larry A. Coldren, now U.S. Pat. No. 6,349,106, issued Feb. 19, 2002, and entitled "METHOD FOR CONVERTING AN OPTICAL WAVELENGTH USING A MONOLITHIC WAVELENGTH CONVERTER ASSEMBLY"; Ser. No. 09/614,375, filed Jul. 12, 2000, by Larry A. Coldren et al., now U.S. Pat. No. 6,658,035, issued Dec. 2, 2003, and entitled "TUNABLE LASER SOURCE WITH INTEGRATED OPTICAL AMPLIFIER"; Ser. No. 09/614,195, filed Jul. 12, 2000, by Larry A. Coldren et al., now U.S. Pat. 6,574,259, issued Jun. 3, 2003, and entitled "METHOD OF MAKING AN OPTO-ELECTRONIC LASER WITH INTEGRATED MODULATOR"; Ser. No. 09/614,665, filed Jul. 12, 2000, by Larry A. Coldren et al., now U.S. Pat. 6,687,278, issued Feb. 3, 2004, and entitled "METHOD OF GENERATING AN OPTICAL SIGNAL WITH A TUNABLE LASER SOURCE WITH INTEGRATED OPTICAL AMPLIFIER"; Ser. No. 09/614,674, filed Jul. 12, 2000, by Larry A. Coldren, now U.S. Pat. No. 6,624,000, issued Sep. 23, 2003, and entitled "METHOD FOR MAKING A MONOLITHIC WAVELENGTH CONVERTER ASSEMBLY"; all of which are incorporated by reference herein, all of which are continuation-in-parts of the others, and all of which claim the benefit under 35 U.S.C. §119(e) to the following U.S. provisional patent applications: Ser. No. 60/152,038, filed on Sep. 2, 1999, by Gregory Fish et al., and entitled "OPTOELECTRONIC LASER WITH INTEGRATED MODULATOR"; Ser. No. 60/152,049, filed on Sep. 2, 1999, by Larry Coldren, and entitled "INTEGRATED OPTOELECTRONIC WAVELENGTH CONVERTER"; and Ser. No. 60/1523,072, filed on Sep. 2, 1999, by Beck Mason et al., and entitled "TUNABLE LASER SOURCE WITH INTEGRATED OPTICAL AMPLIFIER."

This concludes the description of the preferred embodiment of the present invention. In summary, the present invention discloses a tunable laser including a gain section for creating a light beam by stimulated and spontaneous emission over a bandwidth, a phase section for controlling the light beam around a center frequency of the bandwidth, a waveguide for guiding and reflecting the light beam in a cavity including a relatively low energy bandgap separate-confinement-heterostructure (SCH), a front mirror bounding an end of the cavity and a back mirror bounding an opposite end of the cavity wherein gain is provided by at least one of the group comprising the phase section, the front mirror and the back mirror.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A tunable laser comprising:

a waveguide for guiding a light beam, the waveguide including a separate-confinement-heterostructure (SCH) having an energy bandgap that is sufficiently low to provide gain to the light beam;

a front minor defining an end of a cavity within the waveguide;

a back mirror defining an opposite end of the cavity within the waveguide;

the cavity within the waveguide including:

a gain section within the cavity for providing spontaneous emission of the light beam and for providing gain for the light beam, wherein the quantum well bandgap is lower than the SCH in the gain section; and a phase section within the cavity for tuning the light beam around a center frequency of a bandwidth;

wherein reflectivities of the front mirror and the back mirror and the center frequency of the phase section are tuned to be substantially coincident such that the light beam exits the cavity and wherein additional gain for the light beam is provided by at least one of the phase section, the front mirror and the back mirror in order to partially compensate for losses associated with tuning.

2. The laser of claim 1, wherein the gain provided by at least one of the phase section, the front mirror and the back mirror has a saturation power higher than substantially 5 mW.

3. The laser of claim 1, wherein the waveguide including the SCH is uniform across the gain section and the phase section and the front mirror and the back mirror.

4. The laser of claim 3, wherein the SCH includes centered shallow quantum wells.

5. The laser of claim 3, wherein the SCH is optimized such that the gain builds up rapidly to a level substantially equal to that required for a device threshold.

6. The laser of claim 3, wherein each of the gain and phase sections and front and back mirrors has an index that is separately adjusted by biases separately altered at each.

7. The laser of claim 6, wherein the indexes are adjusted while a net gain remains at a device threshold.

8. The laser of claim 3, wherein free-carrier absorption loss resulting from a build up of carriers in the SCH is at least partially compensated for by the gain provided by the at least one of the phase section, the front mirror and the back minor.

9. The laser of claim 1, wherein the gain provided by the at least one of the phase section, the front mirror and the back mirror is modified by a process selected from selective quantum well intermixing, selective area growth and butt-joint regrowth of waveguides of different bandgaps.

10. The laser of claim 1, wherein gain is provided by more than one of the group comprising the phase section, the front mirror and the back mirror and each gain is separately modified by a process selected from the group comprising selective quantum well intermixing, selective area growth and butt-joint regrowth of waveguides of different bandgaps.

11. The laser of claim 10, wherein gain is provided by the front minor modified by selective quantum well intermixing and gain is provided by the back minor modified by selective quantum well intermixing wherein each intermixing produces different bandgap regions.

12. The laser of claim 10, wherein the gain section has relatively low quantum well and high SCH bandgaps.

13. The laser of claim 1, wherein the gain provided by at least one of the group comprising the phase section, the front mirror and the back mirror is applied through an electrical contact interlaced with a tuning electrical contact.

14. An article of manufacture comprising a sampled-grating distributed Bragg reflector (SGDBR) laser, the SGDBR laser comprising:
   a waveguide for guiding a light beam, the waveguide including a separate-confinement-heterostructure (SCH) having an energy bandgap that is sufficiently low to provide gain to the light beam;
   a front mirror defining an end of a cavity within the waveguide;
   a back mirror defining an opposite end of the cavity within the waveguide;
   the cavity within the waveguide including:
      a gain section within the cavity for providing spontaneous emission of a light beam and for providing gain for the light beam, wherein the quantum well bandgap is lower than the SCH in the gain section; and
      a phase section within the cavity for tuning the light beam around a center frequency of the bandwidth;
   wherein reflectivities of the front mirror, the back mirror and the center frequency of the phase section are tuned to be substantially coincident such that the light beam exits the cavity and wherein additional gain for the light beam is provided by at least one of the phase section, the front mirror and the back mirror in order to partially compensate for losses associated with tuning.

15. The article of claim 14, wherein the gain provided by at least one of the phase section, the front mirror and the back mirror has a saturation power higher than substantially 5 mW.

16. The article of claim 14, wherein the waveguide including the SCH is uniform across the gain section and the phase section and the front mirror and the back mirror.

17. The article of claim 16, wherein the SCH includes centered shallow quantum wells.

18. The article of claim 16, wherein the SCH is optimized such that the gain builds up rapidly to a level substantially equal to that required for a device threshold.

19. The article of claim 16, wherein each of the gain and phase sections and front and back mirrors has an index that is separately adjusted by biases separately altered at each.

20. The article of claim 19, wherein the indexes are adjusted while a net gain remains at a device threshold.

21. The article of claim 16, wherein free-carrier absorption loss resulting from a build up of carriers in the SCH is at least partially compensated for by the gain provided by at least one of the group comprising the phase section, the front mirror and the back mirror.

22. The article of claim 14, wherein the gain provided by the at least one of the group comprising the phase section, the front mirror and the back mirror is modified by a process selected from the group comprising selective quantum well intermixing, selective area growth and butt-joint regrowth of waveguides of different bandgaps.

23. The article of claim 14, wherein gain is provided by more than one of the group comprising the phase section, the front mirror and the back mirror and each gain is separately modified by a process selected from the group comprising selective quantum well intermixing selective area growth and butt-joint regrowth of waveguides of different bandgaps.

24. The article of claim 23, wherein gain is provided by the front mirror modified by selective quantum well intermixing and gain is provided by the back mirror modified by selective quantum well intermixing wherein each intermixing produces different bandgap regions.

25. The article of claim 23, wherein the gain section has relatively low quantum well and high SCH bandgaps.

26. The article of claim 14, wherein the gain provided by at least one of the group comprising the phase section, the front mirror and the back mirror is applied through an electrical contact interlaced with a tuning electrical contact.

27. The laser of claim 1, wherein the gain section has relatively low quantum well and high SCH bandgaps.

28. The article of claim 14, wherein the gain section has relatively low quantum well and high SCH bandgaps.

* * * * *

UNITED STATES PATENT AND TRADEMARK OFFICE
CERTIFICATE OF CORRECTION

PATENT NO. : 6,909,734 B2
DATED : June 21, 2005
INVENTOR(S) : Coldren et al.

It is certified that error appears in the above-identified patent and that said Letters Patent is hereby corrected as shown below:

Column 13,
Line 36, "minor" should read -- mirror --.

Column 14,
Line 31, delete "the group comprising".
Lines 34 and 36, delete "the group comprising".

Signed and Sealed this

Thirtieth Day of August, 2005

JON W. DUDAS
*Director of the United States Patent and Trademark Office*